United States Patent
Kumazaki et al.

(10) Patent No.: US 6,885,606 B2
(45) Date of Patent: Apr. 26, 2005

(54) SYNCHRONOUS SEMICONDUCTOR MEMORY DEVICE WITH A PLURALITY OF MEMORY BANKS AND METHOD OF CONTROLLING THE SAME

(75) Inventors: Noriyasu Kumazaki, Kawasaki (JP); Shigeo Ohshima, Yokohama (JP); Kazuaki Kawaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 244 days.

(21) Appl. No.: 10/353,271

(22) Filed: Jan. 28, 2003

(65) Prior Publication Data

US 2003/0142577 A1 Jul. 31, 2003

(30) Foreign Application Priority Data

Jan. 29, 2002 (JP) .................................... 2002-020250
Jul. 15, 2002 (JP) .................................... 2002-206173

(51) Int. Cl.[7] .............................................. G11C 8/00
(52) U.S. Cl. .................. 365/230.03; 365/191; 365/201; 365/233
(58) Field of Search ................................. 365/191, 201, 365/230.03, 233

(56) References Cited

U.S. PATENT DOCUMENTS 5,966,725 A * 10/1999 Tabo .......................... 711/106
6,088,291 A    7/2000 Fujioka et al.
6,275,895 B1 * 8/2001 Tabo .......................... 711/106
6,453,370 B1 * 9/2002 Stracovsky et al. ........... 710/36

FOREIGN PATENT DOCUMENTS

WO    98/56004    12/1998

* cited by examiner

*Primary Examiner*—Van Thu Nguyen
(74) *Attorney, Agent, or Firm*—Hogan & Hartson, LLP

(57) ABSTRACT

A synchronous semiconductor memory device includes a plurality of memory banks which read data from memory cells and write data into the memory cells, a command decoder circuit which receives a command, detects whether the command is a read command or a write command, and, when detecting a read command or a write command, outputs a first control signal that enables a read operation or a write operation in the plurality of memory banks, bank select circuits which activate a second control signal to activate each of the memory banks, and bank timer circuits which deactivate the activated second control signal and perform control in such a manner that the timing with which the second control signal is deactivated in a test mode differs from that in a normal mode.

16 Claims, 11 Drawing Sheets

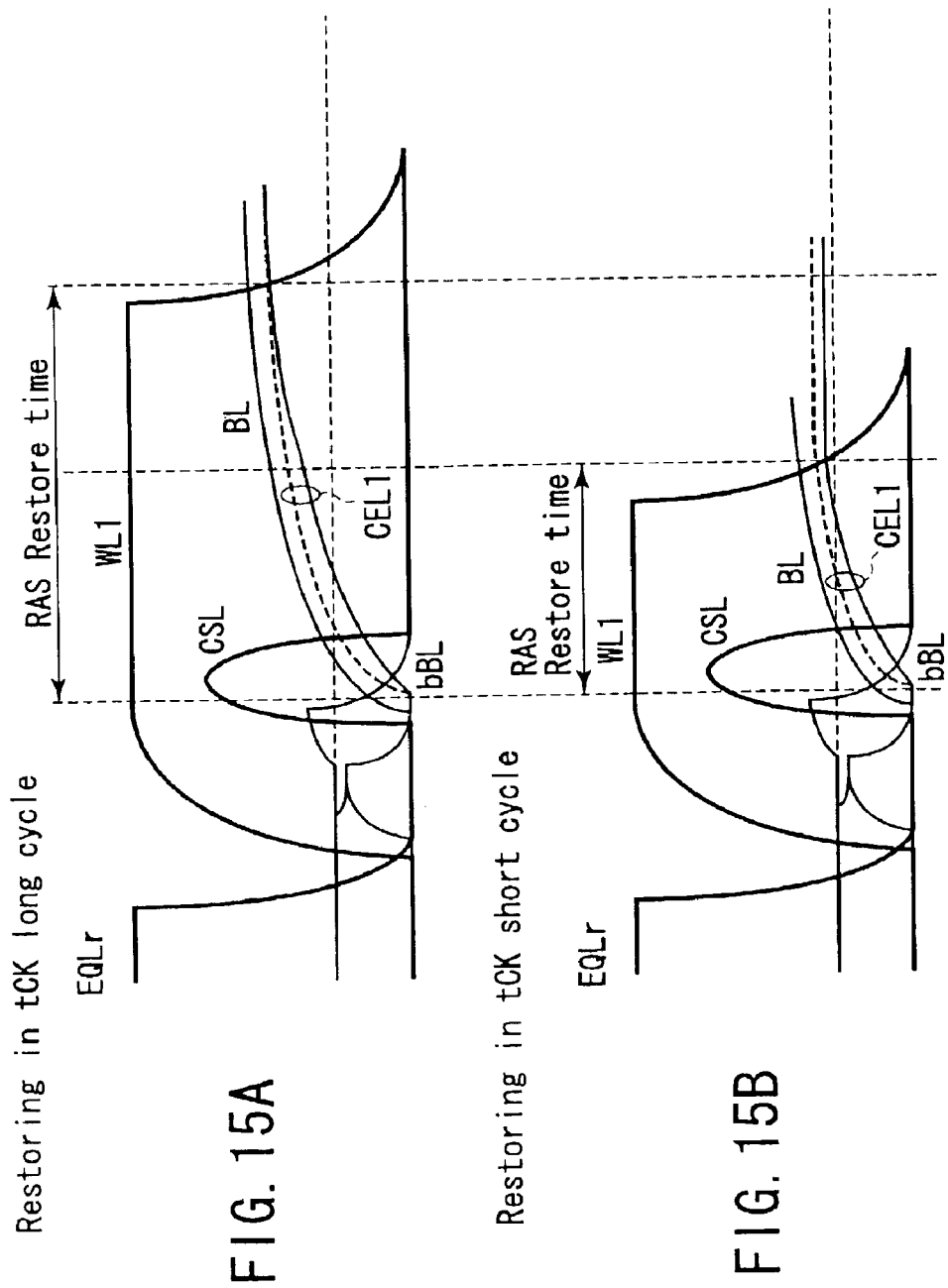
FIG. 15A Restoring in tCK long cycle
FIG. 15B Restoring in tCK short cycle

SYNCHRONOUS SEMICONDUCTOR MEMORY DEVICE WITH A PLURALITY OF MEMORY BANKS AND METHOD OF CONTROLLING THE SAME

CROSS-REFERENCE TO RELATED APPLICATIONS

This application is based upon and claims the benefit of priority from the prior Japanese Patent Applications No. 2002-020250, filed Jan. 29, 2002; and No. 2002-206173, filed Jul. 15, 2002, the entire contents of both of which are incorporated herein by reference.

BACKGROUND OF THE INVENTION

1. Field of the Invention

This invention relates to a high-speed random-cycle external-clock synchronous semiconductor memory device with a plurality of memory banks. More particularly, this invention relates to an improvement in a bank timer circuit that determines a restore period and a precharge starting time in a random cycle time.

2. Description of the Related Art

With recent advances in information technology, there is an increasing demand for semiconductor memories. At the same time, semiconductor memory devices are required to operate faster. Under such conditions, more and more synchronous DRAMs (SDRAMs) that operate in synchronization with an external clock signal have been used instead of memory devices not synchronizing with an external clock signal, such as EDO memories.

There are two types of SDRAMs: single data rate SDRAMs (SDR SDRAMs) and double data rate SDRAMs (DDR SDRAMs). The SDR SDRAM outputs data in synchronization with only the rising edge of the clock signal. The DDR SDRAM outputs the data in synchronization with both the rising edge and the falling edge of the clock signal. Therefore, the DDR SDRAM has a data transfer rate twice as high as that of the SDR SDRAM.

To make the data rate of the DDR SDRAM higher, it is necessary to make the random cycle time (tRC) in the memory core section shorter. The DRAM does destructive reading of cell data. Therefore, when the memory cell selected at a certain address accesses the memory cell corresponding to another row address (or a different word line), a restore operation and a precharge operation are needed, which makes it difficult to makes the random cycle time shorter.

To overcome this drawback, a fast cycle RAM has been developed which has a remarkably improved random access time resulting from improving the core architecture and carrying out an internal operation in a pipelined manner. In the fast cycle RAM, the operation modes, including data write, data read, and refresh, are set by a combination of a first command and a second command.

As described above, the DRAM does destructive reading of cell data. For this reason, a series of operations to access memory cells requires the restore time (tRAS) for selecting a word line, setting the word line at a high potential, and writing the data into the memory cells again and the precharge time (tRP) for precharging a bit line pair, regardless of whether the data is read or written. Therefore, only when the time (tRAS+tRP) has elapsed since a certain address was accessed, the next address cannot be accessed; otherwise the word line is selected doubly. The reason is that all the memory cells are controlled in common.

To overcome the disadvantage, the memory device is divided into a plurality of banks and each bank is controlled independently. With the memory device composed of a plurality of banks, even when memory cells in a certain bank are being accessed, it is possible to access memory cells in a different bank immediately.

Here, the operation in reading the data in a fast cycle RAM with a plurality of banks will be explained. At the same time that a first command corresponding to the data read operation is input, a bank address for determining which bank to access is input. Therefore, after the first command is accepted, the bank corresponding to the input bank address is selected. The length of the period during which the bank is kept selected is equivalent to the length of the period during which the word line is kept driven. The bank select signal for selecting the bank is controlled so as to make the bank unselected automatically after a certain time has elapsed. This control is performed by a bank timer circuit. The bank timer circuit determines the length of the restore time and the starting time of a precharge operation after the restore time.

A conventional bank timer circuit includes an RC delay circuit composed of a resistance element and a capacitance element. In the RC delay circuit, a delay time determined by an RC time constant is set. Then, the delay time determines the length of the restore time and the starting time of the precharge operation.

The resistance element used in the RC delay circuit is highly dependent on processes. That is, the resistance element varies greatly, depending on manufacturing processes. Furthermore, it also varies greatly, depending on external factors, such as temperature and voltage. Therefore, in the conventional bank timer circuit, the length of the restore time and the starting time of the precharge operation vary. As a result, for example, when the length of the restore time gets shorter than the determined length, the restore time cannot be secured sufficiently, leading to a decrease in the amount of data written and therefore causing insufficient restoration, which makes it impossible to secure a sense margin for the next cycle. Therefore, the bank timer circuit is required to have no dependence on processes and always make the length of the restore time and the starting time of the precharge operation stable.

BRIEF SUMMARY OF THE INVENTION

According to an aspect of the present invention, there is provided a synchronous semiconductor memory device comprises: a plurality of memory banks each of which includes a plurality of memory cells connected to a plurality word lines and which read data from the memory cells and write data into the memory cells; a command decoder circuit which receives a command input in synchronization with an external clock signal, detects whether the command is a read command or a write command, and, when detecting a read command or a write command, outputs a first control signal that enables a read operation or a write operation in the plurality of memory banks; a plurality of bank select circuits which are provided for the plurality of memory banks in a one-to-one correspondence, receive the first control signal, activate a second control signal to activate each of the memory banks according to the first control signal, and output the second control signal to the plurality of memory banks; and a plurality of bank timer circuits which are connected to the plurality of bank select circuits in a one-to-one correspondence, and, after the second control signal is activated, deactivate the activated second control signal in synchronization with an internal clock signal synchronizing with the external clock signal, and perform control in such a manner that the timing with which the second control signal is deactivated in a test mode differs from that in a normal mode.

BRIEF DESCRIPTION OF THE SEVERAL VIEWS OF THE DRAWINGS

FIGS. 15A and 15B are waveform diagrams to help explain problems caused by the BS resistance.

DETAILED DESCRIPTION OF THE INVENTION

Hereinafter, referring to the accompanying drawings, an embodiment of the present invention will be explained.

Figure 1:
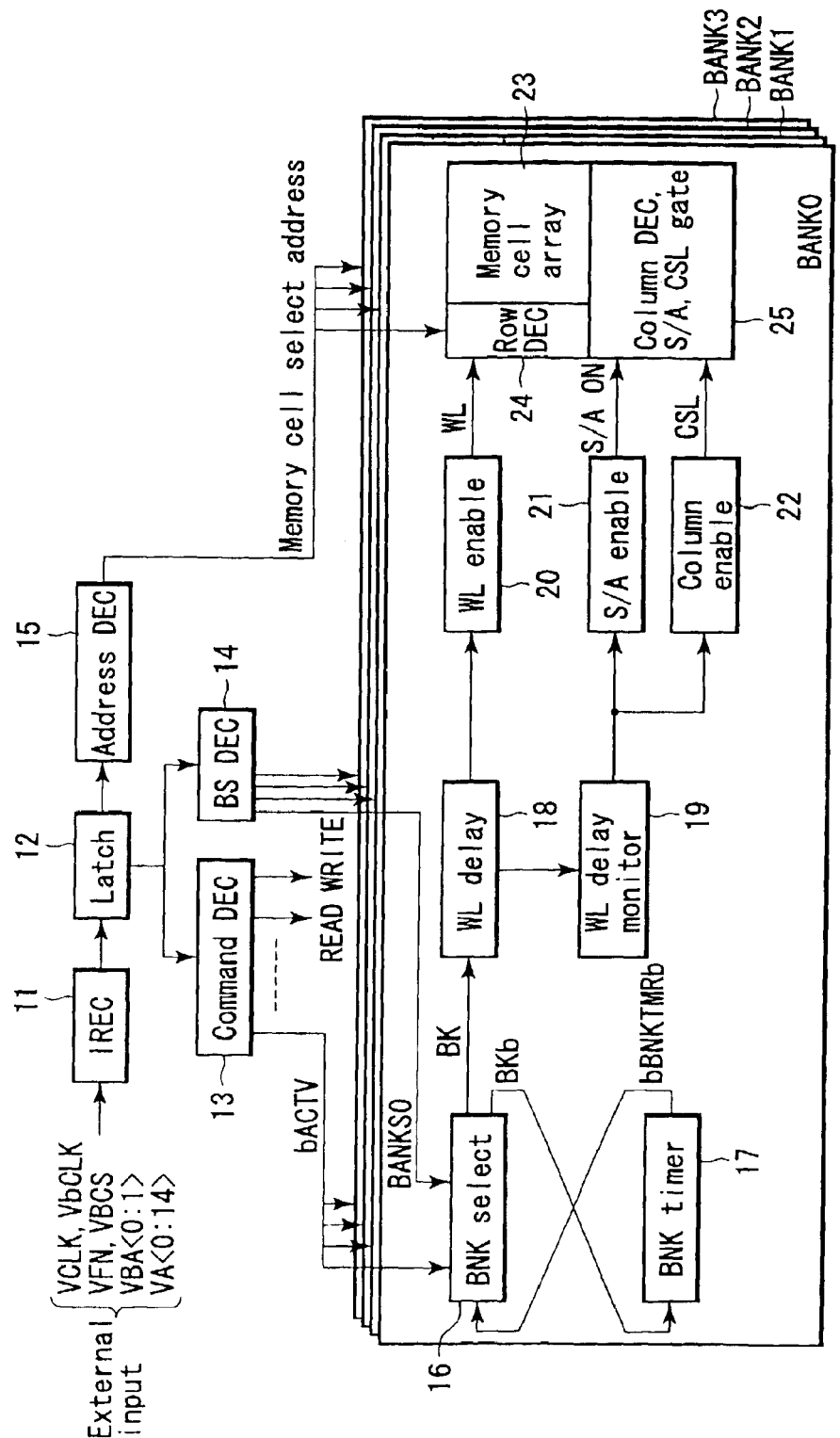
FIG. 1 is a block diagram showing the overall configuration of a fast cycle RAM according to an embodiment of the present invention.

FIG. 1 is a block diagram showing the overall configuration of a fast cycle RAM according to an embodiment of the present invention.

An input receiver (IREC) 11 receives the following externally supplied signals: complementary clock signals VCLK, VbCLK, a first command VFN, a second command VBCS, a 2-bit bank address VBA<0:1>, and a 15-bit address VA<0:14> for memory cell selection. The signals, commands, and addresses received by the input receiver 11 are sent to a latch circuit 12, which latches them. The two commands VFN, VBCS are input in synchronization with the clock signals VCLK, VbCLK. The bank address is input at the same time that the first command is input.

The command latched in the latch circuit 12 is sent to a command decoder (command DEC) 13. The command decoder 13 senses the latched command, and decodes it. When sensing a read command and a write command, the command decoder 13 generates various signals, including a read control signal READ used in reading the data from memory cells in the memory cell array explained later, a write control signal WRITE used in writing the data into memory cells, a control signal bACTV to activate four memory banks BANK0 to BANK3 in read/write operations, and a test mode signal. These signals are supplied in parallel to the four memory banks BANK0 to BANK3.

The bank address latched in the latch circuit 12 is sent to a bank address decoder (BS DEC) 14. The bank address decoder 14 decodes the bank address and activates any one of bank select signals BANKS0 to BANKS3 to select four memory banks BANK0 to BANK3. These bank select signals BANKS0 to BANKS3 are supplied to the memory banks BANK0 to BANK3, respectively.

The address for memory cell selection latched in the latch circuit 12 is sent to an address decoder 15. The address decoder 15 decodes the address and generates a row address and a column address to select memory cells in the memory banks BANK0 to BANK3. These row address and column address are supplied in parallel to the four memory banks BANK0 to BANK3.

The four memory banks BANK0 to BANK3 have an equivalent configuration to each other. For instance, as shown in memory bank BANK0, each memory bank includes a bank select circuit (BNK select) 16, a bank timer circuit (BNK timer) 17, a word-line driving delay circuit (WL delay) 18, a word-line driving delay monitor circuit (WL delay monitor) 19, a word-line driving enable circuit (WL enable) 20, a sense amplifier driving enable circuit (S/A enable) 21, a column driving enable circuit (column enable) 22, a memory cell array 23, a row decoder (row DEC) 24, and a column decoder, sense amplifier, and column select gate circuit (column DEC, S/A, and CSL gate) 25.

When any one of the corresponding bank select signals BANKSi (i=0 to 3) is activated, the bank select circuit 16 activates bank select signals BK, BKb according to the control signal bACTV output from the command decoder 13.

After a specified time has elapsed since the signal BKb was activated, the bank timer circuit 17 outputs a bank timer signal bBNKTRMb. The bank timer signal bBNKTRMb is fed back to the bank select circuit 16. The bank select circuit 16 deactivates the signals BK, BKb on the basis of the bank timer signal bBNKTRMb.

The word-line driving delay circuit 18 delays the signal BK for a specific time and outputs the delayed signal. The output signal of the word-line driving delay circuit 18 is supplied to the word-line driving enable circuit 20. The word-line driving enable circuit 20 outputs a control signal to activate the row decoder 24 according to the output signal of the word-line driving delay circuit 18.

The word-line driving delay monitor circuit 19 receives the output signal of the word-line driving delay circuit 18 and monitors the time from when the output signal of the word-line driving enable circuit 20 is activated until the word line is actually selected and driven. The result of the monitoring is supplied to the sense amplifier driving enable circuit 21 and column driving enable circuit 22.

According to the result of the monitoring, the sense amplifier (S/A) driving enable circuit 21 determines the timing with which the sense amplifier in the column decoder, sense amplifier (S/A), and column select gate circuit (CSL gate) 25 is activated. Similarly, According to the result of the monitoring, the column driving enable circuit 22 determines the timing with which the column select gate in the column decoder, sense amplifier (S/A), and column select gate circuit 25 is activated.

The memory cell array 23 includes a plurality of word lines, a plurality of bit lines, and a plurality of memory cells.

While in the embodiment, four memory banks BANK0 to BANK3 are used, the number of memory banks may be larger than or smaller than four.

Figure 2:
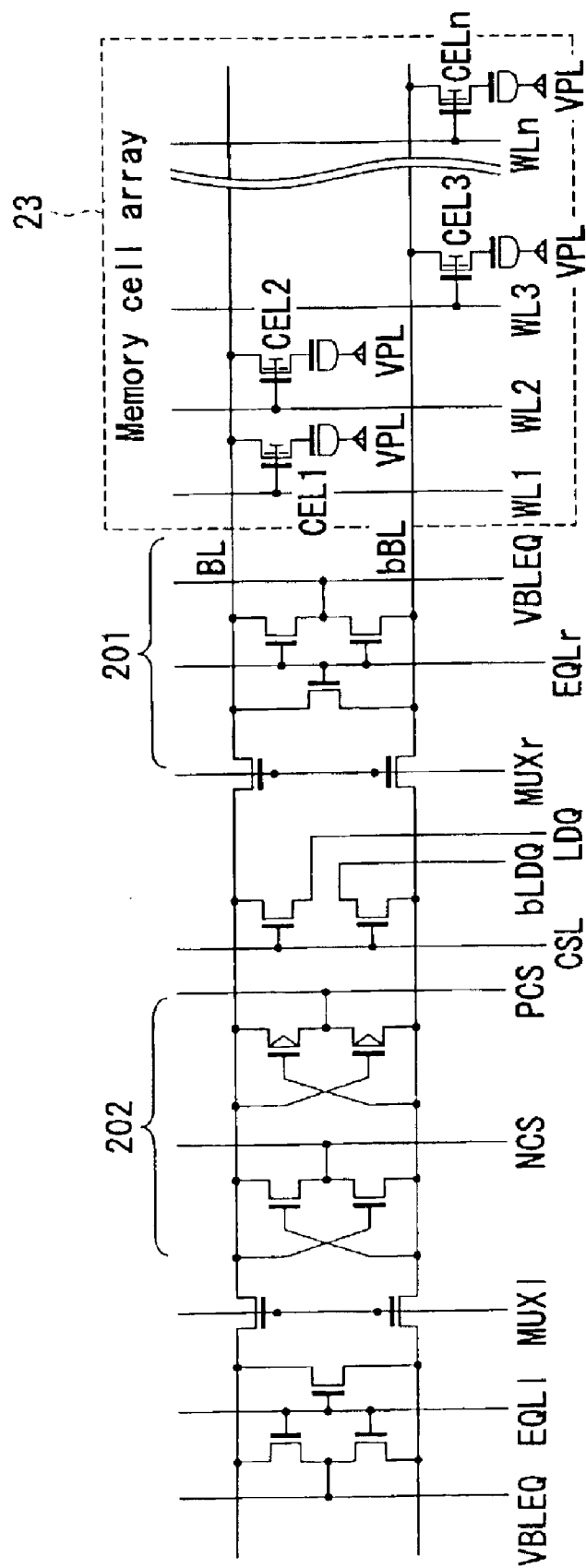
FIG. 2 is a circuit diagram showing the configuration of a part of the fast cycle RAM of FIG. 1, the part including a memory cell array and a sense amplifier circuit.

FIG. 2 shows a detailed configuration of a part of the circuit of FIG. 1, the part including the memory cell array 23 and the sense amplifier circuit in the column decoder, sense amplifier, and column select gate circuit 25.

A plurality of memory cells CEL (CEL1, CEL2, . . . ) are composed of cell transistors and cell capacitors. Each memory cell is placed at each intersection of a plurality of word lines WL (WL1, WL2, . . . ) and a plurality of bit line pairs BL, bBL (in FIG. 2, only one bit line pair is shown). Each memory cell is selected by the signal on the corresponding word line. The read-out signal from the selected memory cell is transmitted to the corresponding bit line.

The word line WL (WL1, WL2, . . . ) corresponding to the address from which the data is to be read is selected. Then, a very low potential is read from the memory cell CEL connected to the word line WL onto the bit line BL or bBL. The bit lines BL, bBL each have been precharged at a fixed potential of VBLEQ by a precharge equalize circuit 201. Then, reading a very small potential corresponding to the cell data from the memory cell causes a very small potential difference to develop between the bit lines BL, bBL. The very small potential difference is amplified by a sense amplifier circuit 202 composed of a p-channel sense amplifier and an n-channel sense amplifier, which outputs the amplified difference as data.

After the data is read, the potential of the word line WL is lowered. Then, the precharge equalize circuit 201 precharges the bit lines BL, bBL at the fixed potential VBLEQ.

The plurality of word lines WL are selectively driven by the row decoder 24 of FIG. 1 to which the row address among the addresses for memory cell selection is supplied. The plurality of bit line pairs BL, bBL are selected by a column select gate in the column decoder, sense amplifier, and column select gate circuit 25. The column select gate is driven by the column decoder to which the column address among the addresses for memory cell selection is supplied.

Here, the bank select circuit 16 activates a bank select signal BK used to drive the word line in the corresponding bank. After a specific time has elapsed since the bank select signal BK was activated, the bank timer circuit 17 deactivates the signal BK. Furthermore, the bank timer circuit 17 performs control in such a manner that the timing with which the activated signal BK is deactivated in the test mode differs from that in the normal mode.

Figure 3:
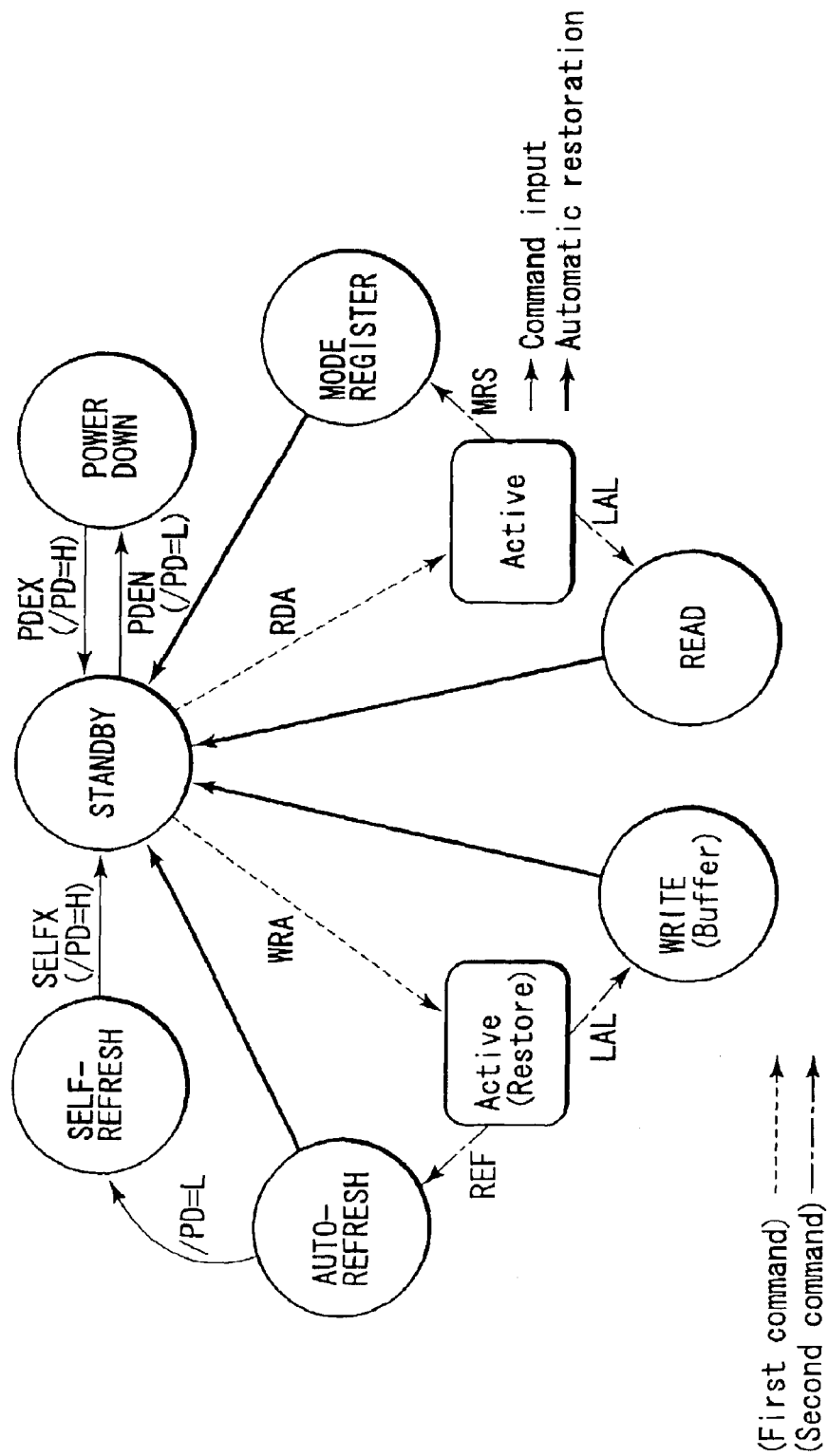
FIG. 3 schematically shows the change of the state of the fast cycle RAM in FIG. 1.

FIG. 3 schematically shows the relationship between the command input and the operation mode in the fast cycle RAM of FIG. 1. An example of the operation mode set according to the command input will be explained. In synchronization with an external clock signal, RDA is input as a first command and LAL is input as a second command, thereby setting the read mode (READ). In addition, WRA is input as a first command and LAL is input as a second command, thereby setting the write mode (WRITE).

Figure 4:
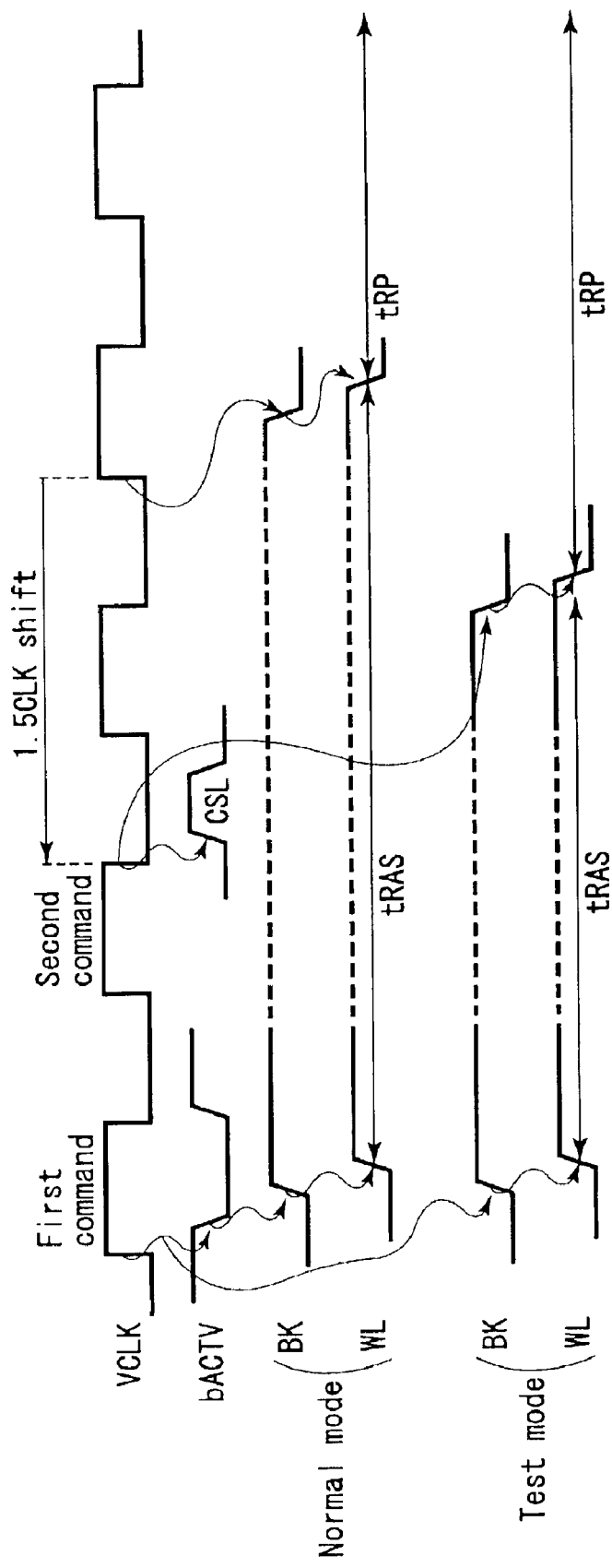
FIG. 4 is a timing chart to help explain a schematic operation of the fast cycle RAM of FIG. 1.

FIG. 4 is a timing chart to help explain a schematic operation of the fast cycle RAM of FIG. 1.

When the first command is input in synchronization with an external clock signal VCLK in the normal mode, signal bACTV goes low in synchronization with the rising of the external clock signal VCLK. Thereafter, the signal BK is activated and goes high, turning on the bank selected state. After the signal BK is activated, the driving of the word line WL is started.

Next, when the second command is input in synchronization with the external clock signal VCLK, a column select signal CSL is made high in synchronization with the falling of the external clock signal VCLK, thereby selecting the column and reading the data from the memory cell.

Then, 1.5 clocks (1.5 CLK shift) of the external clock signal VCLK after the low edge of the second command appears, the bank timer circuit 17 starts to perform deactivation so as to bring the signal BK to the low level.

On the other hand, in the test mode, with the signal BK in the selected state, after a specific time has elapsed since the low edge of the second command, the bank timer circuit 17 performs control so as to bring the signal BK to the low level. The delay time from the low edge of the second command can be adjusted according to the setting state of the test mode.

Specifically, in the test mode, control starts to be performed so as to bring the signal BK to the low level 1.5 clocks of the external clock signal VCLK earlier than in the normal mode. In FIG. 4, tRAS corresponding to the period during which the word line WL is driven at the high level corresponds to the restore time, tRP corresponds to the precharge time, and the sum of tRAS and tRP corresponds to the cycle time (tRC).

Next, each circuit in FIG. 1 will be explained in detail.

Figure 5:
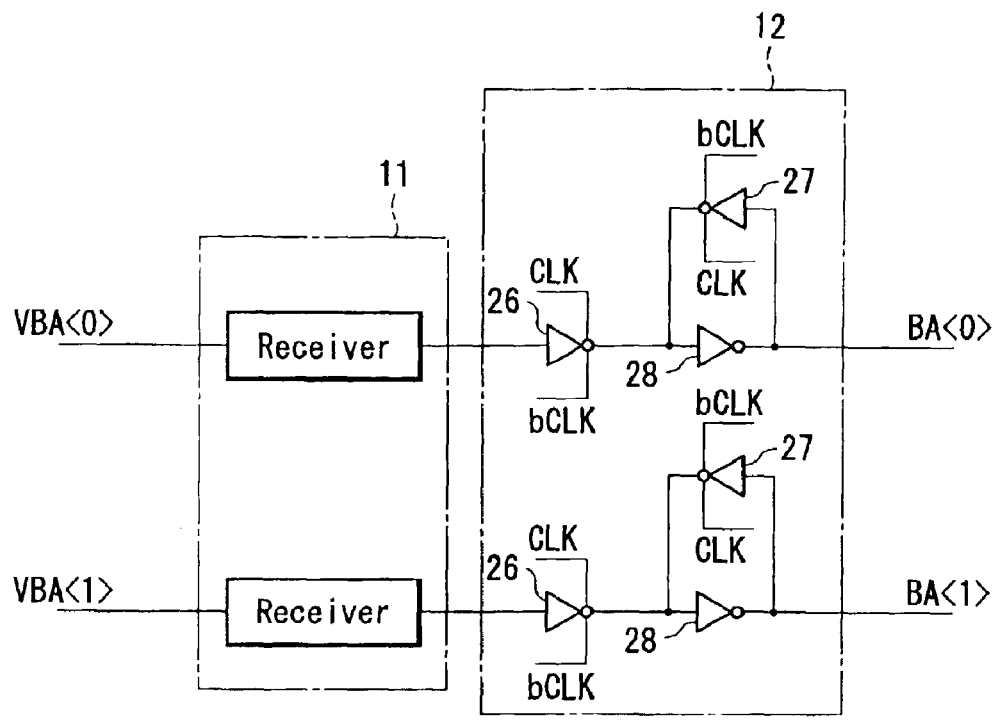
FIG. 5 is a circuit diagram showing a detailed configuration of the input receiver and the part of the latch circuit related to the bank addresses in the fast cycle RAM of FIG. 1.

FIG. 5 shows a detailed circuit configuration of a part of the input receiver 11 and latch circuit 12 of FIG. 1, the part related to bank addresses.

Externally supplied 2-bit bank addresses VBA<0>, VBA<1> are supplied to the latch circuit 12 via the two respective receivers for bank addresses in the input receiver 11. The latch circuit 12 includes two 1-bit latch circuits, each composed of two clocked inverters 26, 27 and an inverter 28. The two clocked inverters 26, 27 operate in synchronization with internal clock signals CLK, bCLK produced from the external clock signals VCLK, VbCLK. The period in which the clocked inverter 26 operates is different from the period in which the clocked inverter 27 operates. The two 1-bit latch circuits latch 2-bit bank addresses VBA<0>, VBA<1> and produce internal addresses BA<0>, BA<1>.

Figure 6:
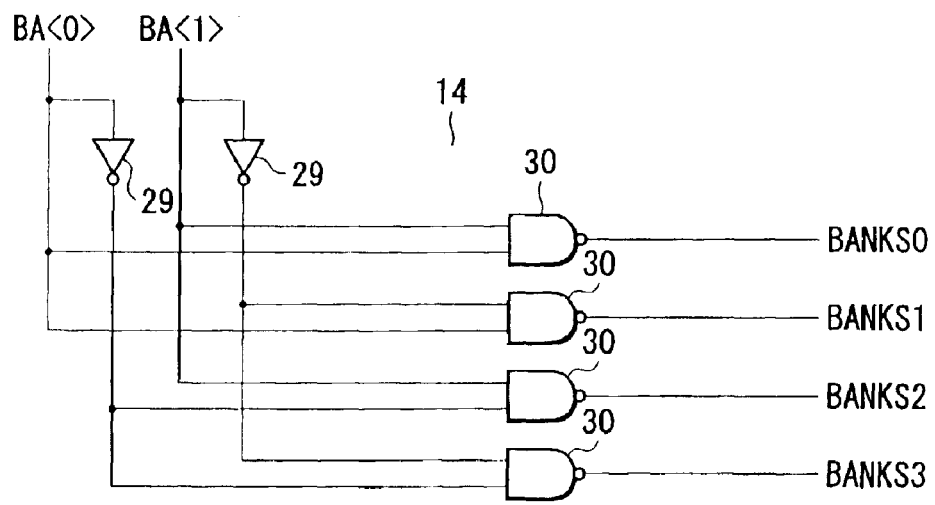
FIG. 6 is a circuit diagram showing a detailed configuration of the bank address decoder in the fast cycle RAM of FIG. 1.

FIG. 6 shows a detailed configuration of the bank address decoder 14 of FIG. 1. The bank address decoder 14 is composed of two inverters 29 that invert the internal bank addresses BA<0>, BA<1>, and four NAND gates 30 to which any one of the internal bank addresses BA<0>, BA<1> and any one of the addresses inverted by the two inverters 29 are input. Then, the four NAND gates 30 output bank select signals BANKS0 to BANKS3.

Figure 7:
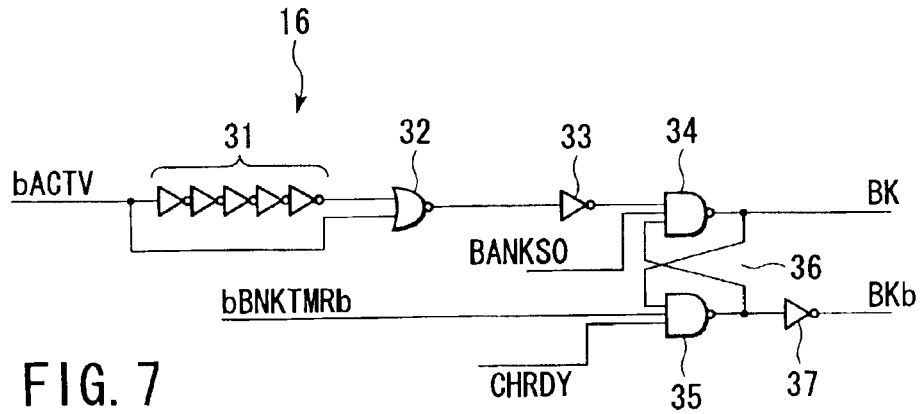
FIG. 7 is a circuit diagram showing a detailed configuration of the bank select circuit in the fast cycle RAM of FIG. 1.

FIG. 7 shows a detailed configuration of the bank select circuit 16 of FIG. 1.

The control signal bACTV generated by the command decoder 13 of FIG. 1 is supplied to one input terminal of a NOR gate 32 via a delay circuit 31 composed of an odd number of (in the embodiment, five) inverters connected in series. The control signal bACTV is also supplied directly to the other input terminal of the NOR gate 32. The output of the NOR gate 32 is supplied via an inverter 33 to one NAND gate 34 of a flip-flop circuit 36 composed of two NAND gates 34, 35. The corresponding one of the four bank select signals BANKS0 to BANKS3 output from the bank address decoder 14 shown in FIG. 6 is supplied to the NAND gate 34. FIG. 7 shows a case where the bank select signal BANKS0 corresponding to bank BANK0 is input. The output of the NAND gate 35 is supplied to the NAND gate 34.

A control signal CHRDY that goes low when the power supply is turned on, a bank timer signal bBNKTRMb that goes low when the memory bank is made unselected, and the output of the NAND gate 34 are supplied to the other NAND gate 35 of the flip-flop circuit 36. Then, the output of the NAND gate 34 is supplied as a bank select signal BK to the word-line driving delay circuit 18 of FIG. 1. The output of the NAND gate 35 is inverted by an inverter 37, thereby producing a signal BKb.

Figure 8:
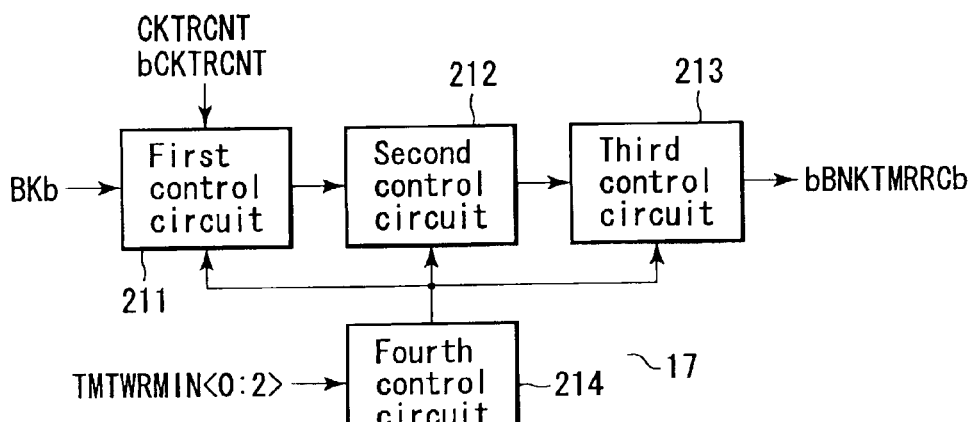
FIG. 8 is a block diagram showing an internal configuration of the bank timer circuit in the fast cycle RAM of FIG. 1.

FIG. 8 is a block diagram showing an internal configuration of the bank timer circuit 17 of FIG. 1.

The bank timer circuit 17 is roughly composed of a first to a fourth control circuit 211 to 214. The first control circuit 211 receives a bank select signal BKb and delays the signal BKb in synchronization with internal clock signals CKTRCNT, bCKTRCNT. In the first control circuit 211, the delay time in the test mode differs from that in the normal mode. The second control circuit 212 receives the output from the first control circuit 211 and delays the output of the first control circuit 211 with a different delay time according to the test mode state. On the basis of the output of the second control circuit 212, the third control circuit 213 outputs a bank timer signal bBNKTRMb to be supplied to the bank select circuit 16 of FIG. 7. The fourth control circuit 214 receives, for example, a 3-bit test mode signal TMTWRMIN<0:2> and generates a control signal to control the operations of the first to third control circuits 211 to 213 according to the test mode signal. The 3-bit test mode signal TMTWRMIN<0:2> is output from the command decoder 13 of FIG. 1.

Figure 9:
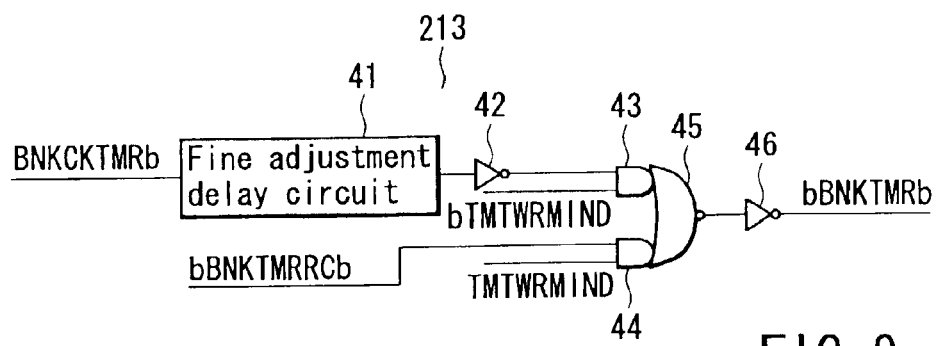
FIG. 9 is a circuit diagram showing a detailed configuration of a third control circuit in the bank timer circuit of FIG. 8.

FIG. 9 shows a detailed configuration of the third control circuit 213 of FIG. 8. A control signal BNKCKTMRb is supplied to one input terminal of an AND gate 43 via a fine adjustment delay circuit 41 and an inverter 42 in this order. A control signal bTMTWRMIND that goes high in the normal mode is supplied to the other input terminal of the AND gate 43. A control signal bBNKTMRRCb, together with a control signal TMTWRMIND complementary to the control signal bTMTWRMIND, is supplied to an AND gate 44. The outputs of both AND gates 43, 44 are supplied to a NOR gate 45. The output of the NOR gate 45 is inverted by an inverter 46, thereby generating the control signal bBNKTRMb.

Figure 10:
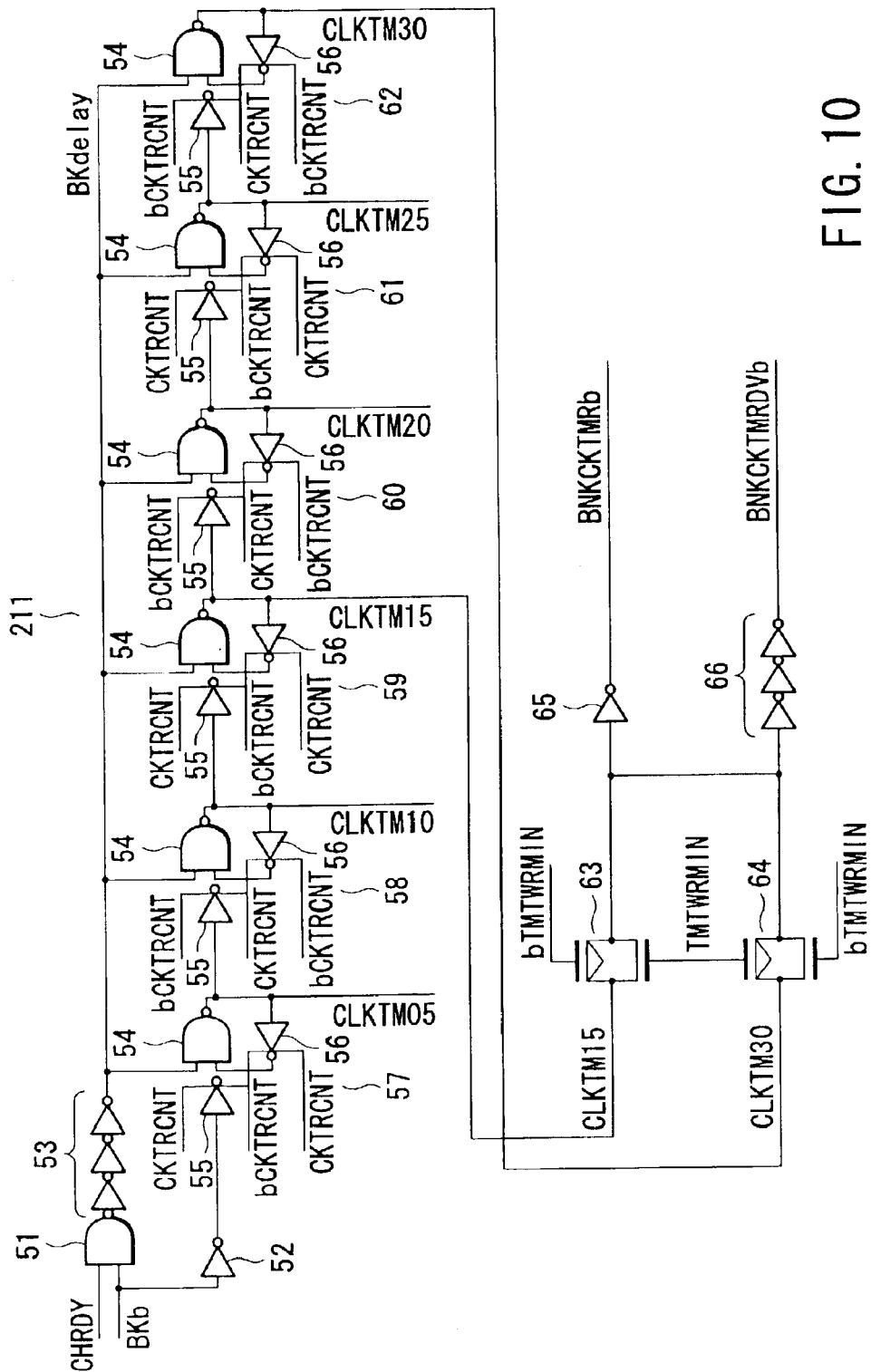
FIG. 10 is a circuit diagram showing a detailed configuration of a first control circuit in the bank timer circuit of FIG. 8.

FIG. 10 shows a detailed configuration of the first control circuit 211 of FIG. 8. A control signal CHRDY that goes high when the power supply is turned on and the signal BKb are supplied to an NAND gate 51. The signal BKb is supplied to an inverter 52. The output of the NAND gate 51 is supplied to a delay circuit 53 composed of an odd number of (in the embodiment, three) inverters connected in series, thereby generating a signal Bkdelay.

Furthermore, the first control circuit 211 includes six half-bit shift circuits 57 to 62, each composed of a NAND gate 54 and two clocked inverters 55, 56. These six half-bit shift circuits 57 to 62 are connected in multistage form. Specifically, in synchronization with the complementary internal clock signals CKTRCNT, bCKTRCNT, the output of the inverter 52 is delayed for half a bit of each of the clock signals CKTRCNT, bCKTRCNT, thereby shifting the output to a subsequent stage. The internal clock signals CKTRCNT, bCKTRCNT are synchronizing with the external clock signals VCLK, VbCLK.

In each of the half-bit shift circuits 57 to 62, the output of the inverter 52 or the output of the NAND gate 54 of the preceding half-bit shift circuit is supplied to the clocked inverter 55. The output of the clocked inverter 55 is supplied to one input terminal of the NAND gate 54 in the corresponding half-bit shift circuit. The signal Bkdelay is supplied to the other input terminal of each NAND gate 54. The clocked inverter 56 is connected so as to feed back the output of the corresponding NAND gate 54 to the other input terminal.

Then, in the half-bit shift circuits 57, 59, 61 at odd-numbered stages, the first stage, the third stage, and the fifth stage, each clocked inverter 55 operates when the internal clock signal CKTRCNT is low and its complementary internal clock signal bCKTRCNT is high and inverts the input signal. Furthermore, each clocked inverter 56 in the half-bit shift circuits at the odd-numbered stages operates when the internal clock signal CKTRCNT is high and its complementary internal clock signal bCKTRCNT is low and inverts the input signal.

Conversely, in the half-bit shift circuits 58, 60, 62 at even-numbered stages, the second stage, the fourth stage, and the sixth stage, each clocked inverter 55 operates when the internal clock signal CKTRCNT is high and its complementary internal clock signal bCKTRCNT is low and inverts the input signal. In addition, each clocked inverter 56 operates when the internal clock signal CKTRCNT is low and its complementary internal clock signal bCKTRCNT is high and inverts the input signal.

Then, the half-bit shift circuits 57 to 62 output shift signals CLKTM05, CLKTM10, CLKTM15, CLKTM20, CLKTM25, CLKTM30, respectively. The number added at the end of each shift signal represents how many clocks of the internal clock signals CKTRCNT, bCKTRCNT the shift signal has been shifted (or delayed) from the signal BKb. For example, the shift signal CLKTM05 represents a signal half a clock of the internal clock signals CKTRCNT, bCKTRCNT shifted from the signal BKb. The shift signal CLKTM30 represents a signal three clocks of the internal clock signals CKTRCNT, bCKTRCNT shifted from the signal BKb.

The shift signal CLKTM15 one and a half clocks of the internal clock signals CKTRCNT, bCKTRCNT shifted from the signal BKb is supplied to one end of a transfer gate 63 composed of a p-channel and an n-channel MOS transistor. Similarly, the shift signal CLKTM30 three clocks of the internal clock signals CKTRCNT, bCKTRCNT shifted from the signal BKb is supplied to one end of a transfer gate 64 composed of a p-channel and an n-channel MOS transistor. The conduction of each of the transfer gates 63, 64 is controlled by signals TMTWRMIN, bTMTWRMIN complementary to each other.

One transfer gate 63 conducts when the control signal TMTWRMIN is high and the control signal bTMTWRMIN is low. The other transfer gate 64 conducts when the control signal TMTWRMIN is low and the control signal bTMTWRMIN is high.

The other ends of the transfer gates 63, 64 are connected to each other, making the other-end common junction point. The signal at the common junction point is inverted by an inverter 65, which produces a control signal BNKCKTMRb. Furthermore, the signal at the common junction point of the transfer gates 63, 64 is inverted and delayed by a delay circuit 66 composed of an odd number of (in the embodiment, three) inverters connected in series. The delay circuit 66 generates the control signal BNKCKTMRDVb. The control signal BNKCKTMRb is supplied to the fine adjustment delay circuit 41 of FIG. 9.

FIGS. 11A to 11G show a detailed configuration of the fourth control circuit 214 of FIG. 8. In the test mode, the fourth control circuit 214 decodes the test mode signal to adjust the delay time for the bank timer signal according to the setting state of the test mode. In this embodiment, three bits, TMTWRMIN<0>, TMTWRMIN<1>, TMTWRMIN<2>, are input as test mode signals. The test modes signal TMTWRMIN<0>, TMTWRMIN<1>, TMTWRMIN<2> are output from the command decoder 13 of FIG. 1. An example of the relationship between the test mode signals and the delay time adjusted for the bank timer signal is shown in Table 1.

TABLE 1

| TMTWRMIN<0> | TMTWRMIN<1> | TMTWRMIN<2> | Adjusted value |
|---|---|---|---|
| "0" | "0" | — | initial |
| "1" | "0" | "0" | +4.71 (ns) |
| "1" | "0" | "1" | +6.10 (ns) |
| "0" | "1" | "0" | +2.35 (ns) |
| "0" | "1" | "1" | +3.42 (ns) |
| "1" | "1" | "0" | +6.81 (ns) |
| "1" | "1" | "1" | +8.26 (ns) |

As shown in Table 1, when both of the test mode signals TMTWRMIN<0>, TMTWRMIN<1> are "0," the delay time is not adjusted (initial), regardless of the level of the test mode signal TMTWRMIN<2>. When both of the test mode signals TMTWRMIN<0> and TMTWRMIN<2> are "0" and the test mode signal TMTWRMIN<1> is "1," a delay of, for example, 2.35 ns is added to the bank timer signal. Thereafter, the delayed signal is output from the bank timer circuit 17. When the test mode signal TMTWRMIN<0> is "0" and both of the test mode signals TMTWRMIN<1>, TMTWRMIN<2> are "1," a delay of, for example, 3.42 ns is added to the bank timer signal. Thereafter, the delayed signal is output from the bank timer circuit 17. Hereinafter, a specific delay is added to the bank timer signal according to the test mode signals TMTWRMIN<0>, TMTWRMIN<1>, TMTWRMIN<2> in the same manner. Thereafter, the delayed signal is output from the bank timer circuit 17.

Figure 11A:
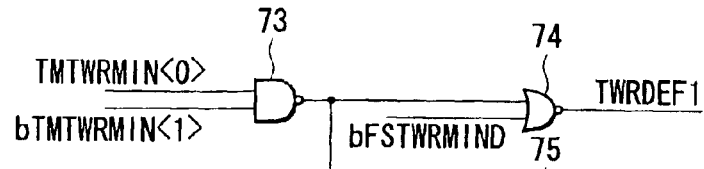
FIGS. 11A to 11G are circuit diagrams showing a detailed configuration of a fourth control circuit in the bank timer circuit of FIG. 8.
Figure 11B:
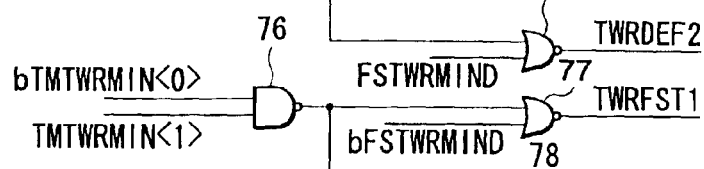
Figure 11C:
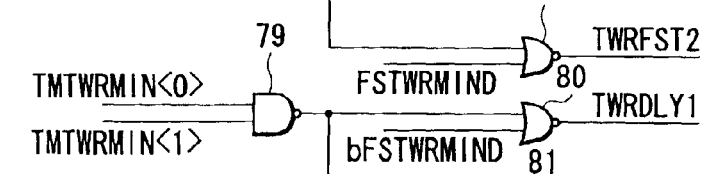
Figure 11D:
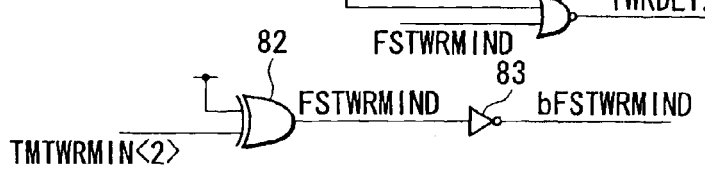
Figure 11E:
Figure 11F:
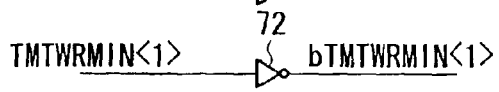

In FIGS. 11E and 11F, inverters 71, 72 invert the test mode signals TMTWRMIN<0>, TMTWRMIN<1> and output signals bTMTWRMIN<0>, bTMTWRMIN<1>, respectively.

As shown in FIG. 11A, the test mode signal TMTWRMIN<0> and the inverted signal bTMTWRMIN<1> are supplied to a NAND gate 73. The output of the NAND gate 73, together with a signal bFSTWRMIND explained later, is supplied to a NOR gate 74. The NOR gate 74 outputs a first decode signal TWRDEF1. The output of the NAND gage 73, together with a signal FSTWRMIND, is supplied to a NOR gate 75. The NOR gate 75 outputs a second decode signal TWRDEF2.

As shown in FIG. 11B, the inverted test mode signal bTMTWRMIN<0> and the test mode signal TMTWRMIN<1> are supplied to a NAND gate 76. The output of the NAND gate 76, together with a signal bFSTWRMIND, is supplied to a NOR gate 77. The NOR gate 77 outputs a third decode signal TWRFST1. The output of the NAND gate 76, together with a signal FSTWRMIND, is supplied to a NOR gate 78. The NOR gate 78 outputs a fourth decode signal TWRFST2.

As shown in FIG. 11C, the test mode signals TMTWRMIN<0>, TMTWRMIN<1> are supplied to a NAND gate 79. The output of the NAND gate 79, together with a signal bFSTWRMIND, is supplied to a NOR gate 80. The NOR gate 80 outputs a fifth decode signal TWRDLY1. The output of the NAND gate 79, together with a signal FSTWRMIND, is supplied to a NOR gate 81. The NOR gate 81 outputs a sixth decode signal TWRDLY2.

Here, the relationship between the test mode signals TMTWRMIN<0>, TMTWRMIN<1>, TMTWRMIN<2> and the selected state of the first to sixth decode signals is shown in Table 2.

TABLE 2

| TMTWRMIN<0> | TMTWRMIN<1> | TMTWRMIN<2> | Decode signal |
|---|---|---|---|
| "0" | "0" | — | initial |
| "1" | "0" | "0" | TWRDEF1 |
| "1" | "0" | "1" | TWRDEF2 |
| "0" | "1" | "0" | TWRFST1 |
| "0" | "1" | "1" | TWRFST2 |
| "1" | "1" | "0" | TWRDLY1 |
| "1" | "1" | "1" | TWRDLY2 |

In FIG. 11D, a circuit composed of an exclusive OR gate 82 and an inverter 83 is for generating the signals FSTWRMIND, bFSTWRMIND. One input terminal of the exclusive OR gate 82 is connected to a power supply node. A high signal is always supplied to the input terminal. The test mode signal TMTWRMIN<2> is supplied to the other input terminal of the exclusive OR gate 82. Then, the exclusive OR gate 82 outputs the signal FSTWRMIND. The signal FSTWRMIND is inverted by an inverter 83, thereby outputting the signal bFSTWRMIND.

Figure 11G:
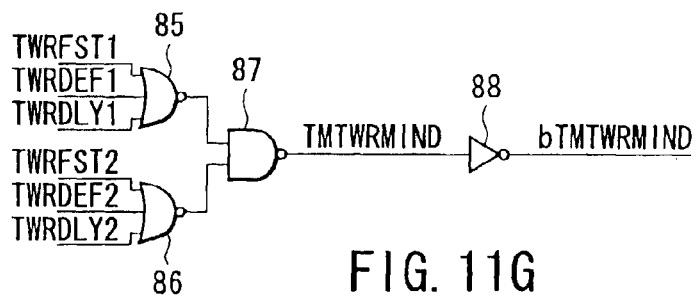

FIG. 11G shows a circuit that generates control signals TMTWRMIND, bTMTWRMIND from the first to sixth decode signals output from the circuits of FIGS. 11A to 11C. The control signals TMTWRMIND, bTMTWRMIND are used in the first to third control circuits 211 to 214 in FIG. 8. The first, third, and fifth decode signals TWRDEF1, TWRFST1, TWRDLY1 are supplied to a NOR gate 85. The second, fourth, and sixth decode signals TWRDEF2, TWRFST2, TWRDL2 are supplied to a NOR gate 86. The outputs of the NOR gates 85, 86 are supplied to a NAND gate 87. The NAND gate 87 outputs a signal TMTWRMIND. The signal TMTWRMIND is inverted by an inverter 88, thereby generating a signal bTMTWRMIND.

Figure 12:
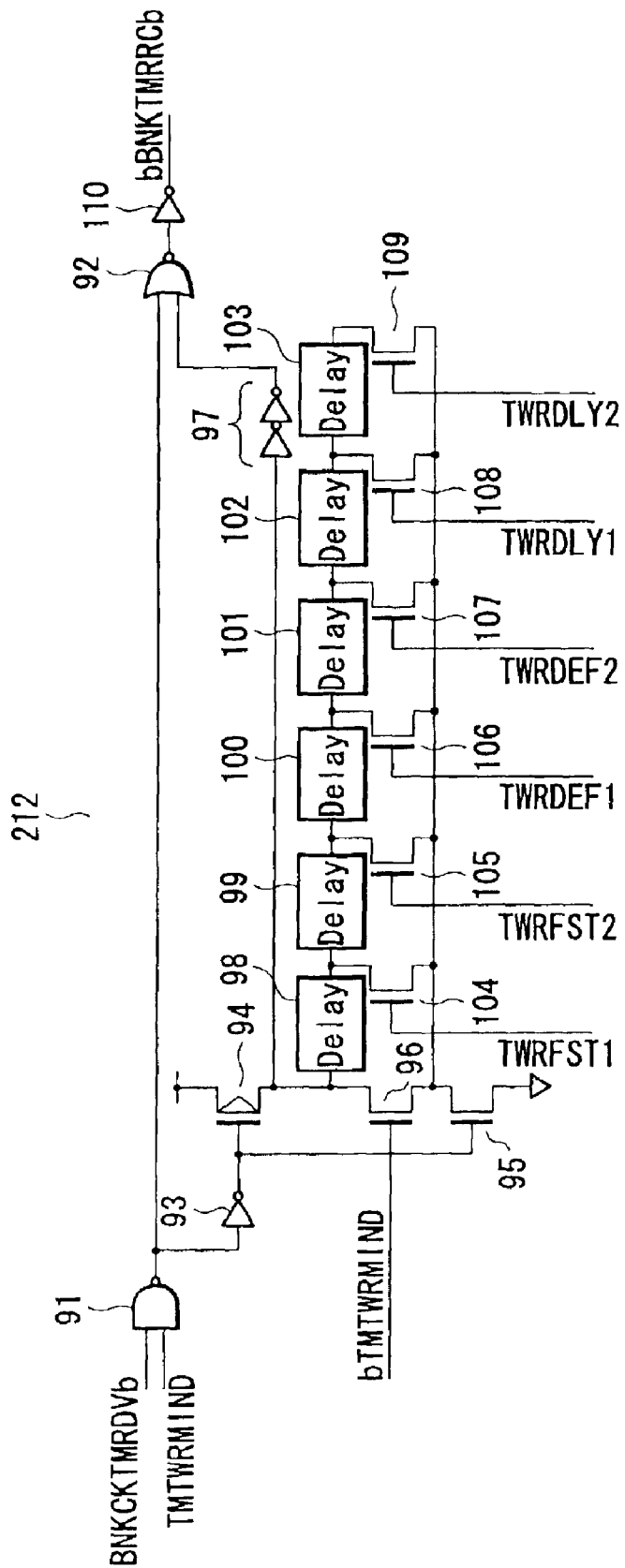
FIG. 12 is a circuit diagram showing a detailed configuration of a second control circuit in the bank timer circuit of FIG. 8.

FIG. 12 shows a detailed configuration of the second control circuit 212 of FIG. 8. A signal BNKCKTMRDVb and the signal TMTWRMIND output from the circuit of FIG. 11G are supplied to a NAND gate 91. The output of the NAND gate 91 is supplied to not only one input terminal of a NOR gate 92 but also an inverter 93. The output of the inverter 93 is supplied to the gate of a p-channel MOS transistor 94 and the gate of an n-channel MOS transistor 95. The source of the p-channel MOS transistor 94 is connected to a power supply node. The source of the n-channel MOS transistor 95 is connected to a node of the ground potential. The source-drain of an n-channel MOS transistor 96 is inserted between the drains of the p-channel and n-channel MOS transistors 94, 95. A signal bTMTWRMIND is supplied to the gate of the n-channel MOS transistor 96.

The input terminal of a delay circuit 97 composed of an even number of (in the embodiment, two) inverters connected in series is connected to the drain of the MOS transistor 94. The output terminal of the delay circuit 97 is connected to the other input terminal of the NOR gate 92. One end of a plurality of (in the embodiment, six) delay circuits 98 to 103 connected in series is connected to the drain of the MOS transistor 94. Then, the source-drain of each of n-channel MOS transistors 104 to 109 is inserted between the corresponding output node of the delay circuits 98 to 103 connected in series and the drain of the MOS transistor 95. The first to sixth decode signals output from the circuits of FIGS. 11A to 11C are supplied to the n-channel MOS transistors 104 to 109, respectively. Specifically, the third decode signal TWRFST1 is supplied to the gate of the n-channel MOS transistor 104. The fourth decode signal TWRFST2 is supplied to the gate of the n-channel MOS transistor 105. The first decode signal TWRDEF1 is supplied to the gate of the n-channel MOS transistor 106. The second decode signal TWRDEF2 is supplied to the gate of the n-channel MOS transistor 107. The fifth decode signal TWRDLY1 is supplied to the gate of the n-channel MOS transistor 108. The sixth decode signal TWRDLY2 is supplied to the gate of the n-channel MOS transistor 109.

Then, the signal bBNKTMRRCb whose delay time is adjusted at the second control circuit 212 of FIG. 12 is generated by an inverter 110 that inverts the output of the NOR gate 92. The signal bBNKTMRRCb is supplied to the AND gate 44 in the third control circuit 213 of FIG. 9.

The fast cycle RAM with the above configuration will be explained, centering on the operations of the bank select circuit and bank timer circuit.

When the power supply is turned on, the signal CHRDY goes low, causing the output of the NAND gate 35 constituting the flip-flop circuit 36 of FIG. 7 to go high, which brings the signal BKb to the low level. At this time, the signal bACTV is at the high level, the output of the NOR gate 32 is at the low level, and the output of the inverter 33 is at the high level.

Thereafter, it is assumed that the first command, together with a bank address, is input to specify bank BANK0. Specifying bank BANK0 causes bank select signal BANKS0 to go high, bringing the signal BK, the output of the NAND gate 34, to the low level, which turns on the bank unselected state.

When the control signal bACTV goes low after the first command is input, the output of the NOR gate 32 goes high and the output of the inverter 33 goes low before the output of the delay circuit 31 changes from the low level to the high level after the delay time in the delay circuit 31 has elapsed. Thereafter, the output of the NAND gage 34, or the signal BK, goes high, which turns on the bank select state. In the bank select state, the word-line driving delay circuit 18, word-line driving delay monitor circuit 19, word-line driving enable circuit 20, sense amplifier driving enable circuit 21, and column driving enable circuit 22 operate, thereby carrying out the driving operation of the word lines and the sensing operation of the sense amplifier, which starts the data read and write operations in the memory cell array 23.

At this time, it is assumed that the signal CHRDY has changed to the high level and the signal bBNKTMRb is at the high level. Then, the output of the NAND gate 35 is inverted to the low level and the signal BKb goes high. The signal BKb is input to the first control circuit 211 of FIG. 10.

In the first control circuit 211, because the signal CHRDY is already at the high level, when the signal BKb goes high, the output of the NAND gate 51 goes low, causing the signal Bkdelay, the output of the delay circuit 53, to go high. When the signal Bkdelay goes high, this enables each NAND gate 54 in the half-bit shift circuits 57 to 62, which makes it possible for the half-bit shift circuits 56 to 62 to operate. That is, after they can operate, the output of the inverter 52 is shifted (or delayed) half a bit of the internal clock signals CKTRCNT, bCKTRCNT sequentially over the six half-bit shift circuits 57 to 62 in synchronization with the internal clock signals CKTRCNT, bCKTRCNT. As a result, the shift signals CLKTM05, CLKTM10, CLKTM15, CLKTM20, CLKTM25, CLKTM30 are changed from the high level to the low level in sequence.

In the normal mode, the signal TMTWRMIN output from the circuit of FIG. 11G is at the low level and the signal bTMTWRMIN is at the high level. Therefore, the transfer gate 64 of FIG. 10 turns on. As a result, the shift signal CLKTM30 from the half-bit shift circuit 62 which goes low three clocks after the appearance of the signal BKb passes through the transfer gate 64 and is supplied to the inverter 65 and delay circuit 66.

That is, in the normal mode, three clocks of the internal clock after the signal BKb goes high, the signals BNKCK-TMRb and BNKCKTMRDVb go high in synchronization with the internal clock signals CKTRCNT, bCKTRCNT.

When the signal BNKCKTMRb goes high, the output of the inverter 42 in the third control circuit 213 of FIG. 9 goes low. In the normal mode, because the signal bTMTWR-MIND supplied to the AND gate 43 of FIG. 9 is at the high level, the output of the inverter 42 goes low and then the output of the AND gate 43 goes low. As a result, the output of the NOR gate 45 of FIG. 9 goes high, bringing the signal bBNKTMRb, the output of the inverter 46, to the low level. Consequently, the output of the NAND gate 35 of FIG. 7 to which the signal bBNKTMRb is supplied goes high, bringing the signal BKb, the output of the inverter 37, into the low level. Furthermore, after the output of the NAND gate 35 goes high, the output of the NAND gage 34, or the signal BK, goes low, which turns on the bank unselected state again.

As described above, in the normal mode, after the first command is input and the signal bACTV goes low, the signals BK and BKb go high, turning on the bank select state. Thereafter, the signals BK and BKb go low after three clocks of the internal clock signal. That is, three clocks after the selection of the bank is selected, control is so performed that the bank unselected state is turned on automatically.

Next, the operation in the test mode will be explained.

Because the operations from when the signals BK and BKb go high until the bank is selected are the same as those in the normal mode, explanation of them will be omitted.

In the test mode, when the test mode is input, the signal TMTWRMIN output from the circuit of FIG. 11G goes high and the signal bTMTWRMIN goes low, turning on the transfer gate 63 in the first control circuit 211 of FIG. 10. As a result, the shift signal CLKTM15 from the half-bit shift circuit 59 which goes low one and a half clocks after the signals BK and BKb go high passes through the transfer gate 63 and is supplied to the inverter 65 and delay circuit 66.

That is, in the test mode, after the signals BK and BKb go high, the signals BNKCKTMRb and BNKCKTMRDVb go high one and a half clocks later in synchronization with the internal clock signal.

Because the signal TMTWRMIND is already at the high level, when the signal BNKCKTMRb goes high, the output of the NAND gate 91 in the second control circuit 212 of FIG. 12 goes low and the output of the inverter 93 goes high. This turns on the n-channel MOS transistor 95 of FIG. 12.

In the test mode, because the signal bTMTWRMIND is at the low level, the n-channel MOS transistor 96 turns off, separating the drain of the p-channel MOS transistor 94 from the drain of the n-channel MOS transistor 95.

On the other hand, before the signal BNKCKTMRb goes high, the output of the NAND gate 91 of FIG. 12 is at the high level and the output of the inverter 93 is at the low level, turning on the p-channel MOS transistor 94 of FIG. 12. When the p-channel MOS transistor 94 is turned on, the input to the delay circuit 97 of FIG. 12 goes high. Then, the output of the delay circuit 97 then goes high. As a result, the output of the NOR gate 92 goes low, bringing the output of the inverter 110 to the high level.

In this state, when the n-channel MOS transistor 95 turns on, the drain of the p-channel MOS transistor 94 is discharged to the ground potential via a series connection of any one of a plurality of delay circuits 98 to 103 connected in series, any one of a plurality of n-channel MOS transistors 104 to 109, and the n-channel MOS transistor 95. For example, the test mode signals bTMTWRMIN<0>, TMTWRMIN<1>, TMTWRMIN<2> are "0," "1," and "0," the third decode signal TWRFST1 goes high in the circuit of FIG. 11B. As a result, the n-channel MOS transistor 104 to which the signal TWRFST1 is supplied turns on, causing the drain of the p-channel MOS transistor 94 to be discharged to the ground potential via a series connection of the delay element 98, n-channel MOS transistor 104, and n-channel MOS transistor 95.

Furthermore, for example, when such a test mode signal as causes the fourth decode signal TWRFST2 to go high is input, the n-channel MOS transistor 105 to which the signal TWRFST2 is supplied turns on, causing the drain of the p-channel MOS transistor 94 to be discharged to the ground potential via a series connection of the delay circuits 98, 99, n-channel MOS transistor 105, and n-channel MOS transistor 95.

When the drain of the p-channel MOS transistor 94 goes low as a result of the discharging, the output of the delay circuit 97 also goes low, causing the output of the NOR gate 92 to be inverted to the high level, which causes the signal bBNKTMRRCb, the output of the inverter 110, to be inverted to the low level.

Here, during the time from when the signal BNKCKT-MRDVb input to the NAND gate 91 goes high until the signal bBNKTMRRCb output from the inverter 110 is inverted to the low level, a suitable value can be selected from Table 1 according to the setting state of the test mode.

In the test mode, because the signal TMTWRMIND supplied to the AND gate 44 of FIG. 9 is at the high level, when the signal bBNKTMRRCb goes low, the output of the AND gate 44 of FIG. 9 goes low. As a result, the output of the NOR gate 45 of FIG. 9 goes high, causing the signal bBNKTMRb, the output of the inverter 46. to go low. Furthermore, the output of the NAND gate 35 to which the signal bBNKTMRb is supplied is inverted to the high level, causing the signal BKb, the output of the inverter 37, to go low. After the output of the NAND gate 35 is inverted to the high level, the output of the NAND gate 34, or the signal BK, is also inverted to the low level.

As described above, in the test mode, after the first command is input and the signal bACTV goes low, the signals BK and BKb go high, turning on the bank select state. Then, one and a half clocks of the internal clock signal later, the signal BNKCKTMRDVb goes high. In the second control circuit 212 of FIG. 12, the signal BNKCKTMRDVb is delayed for a delay time corresponding to the test mode setting state. Then, the signals BK and BKb go low, which brings the bank into the unselected state.

That is, providing the bank timer circuit makes it possible to perform bank control as described in FIG. 4.

Since use of the bank timer circuit 17 with the above configuration enables the bank select signal BK to be deactivated 1.5 clocks or 3 clocks of the internal clock signal after the bank select signal BK is activated, it is possible to always stabilize the length of the restore time and the starting time of the precharge operation with no dependence on processes.

Furthermore, the delay time in deactivating the activated bank select signal BK in the test mode is made different from that in the normal mode by means of the bank timer circuit. Here, a case where the activated bank select signal BK is activated with constant timing will be considered.

Figure 13:
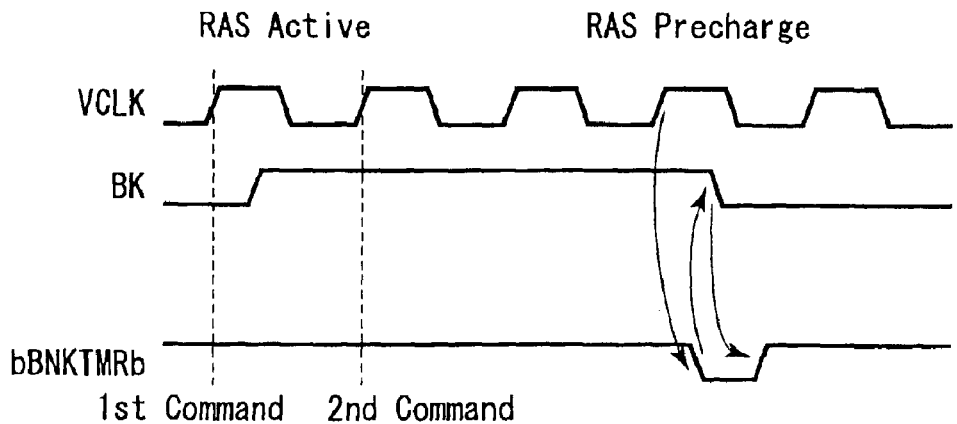
FIG. 13 is a timing chart to help explain an example of the operation of the bank timer circuit.

FIG. 13 is a timing chart to help explain the operation in the case where the signal BK is deactivated 3 clocks of the clock signal VCLK after the bank select signal BK is activated (or goes high).

When the signal BKb is at the low level, the signal bBNKTMRc is at the high level. Next, the first command is input in synchronization with the external clock signal VCLK, causing the signal BK to go high (into the bank select state). Then, 3 clocks of the external clock signal later, the signal bBNKTMRc goes low. Thereafter, the signal BK goes low.

Specifically, when the activated bank select signal BK is deactivated with constant timing, this enables control to be performed in such a manner that the word line WL goes low three clocks after the first command is input, regardless of the short cycle with a short cycle time or the long cycle with a long cycle time. Therefore, there is no possibility that the word line WL goes low before the control signal CSL goes high.

Since the falling of the bank select signal BK is controlled in synchronization with the clock signal, the bank timer circuit of the embodiment has the advantage of depending less on processes (e.g., variations in resistance), power supply voltages, and temperature than a conventional bank timer circuit using an RC delay circuit and of securing the restore time sufficiently even in the long cycle.

However, there is a problem arising from synchronization with the clock signal. The problem is to be incapable of screening defects due to a BS resistance or the like in screening the memory cells in the die sort test.

Figure 14:
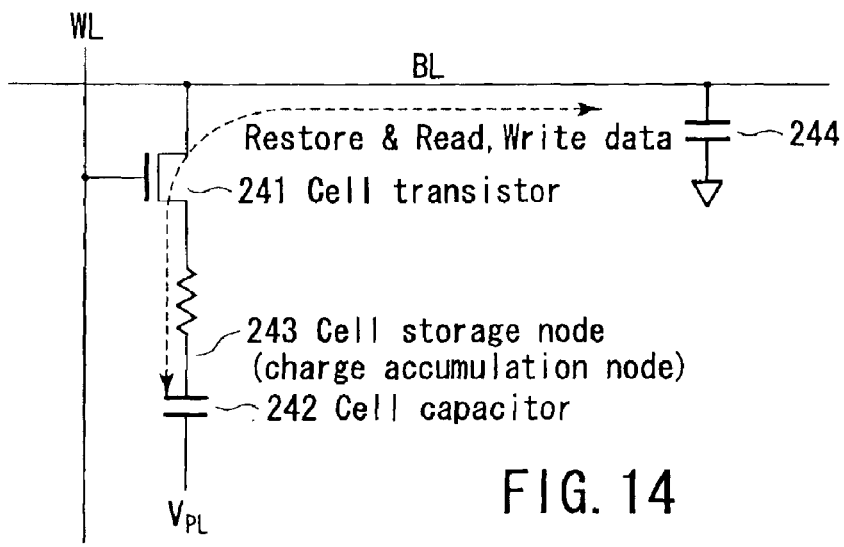
FIG. 14 is a circuit diagram to help explain a state where BS resistance develops in a memory cell.

Here, in FIG. 14, the BS resistance is a parasitic resistance developing between a cell transistors 241 and a cell capacitor 242 in a memory cell, that is, on a storage node 243, or a resistance depending on processes.

The problem caused by the BS resistance will be explained by reference to FIGS. 15A and 15B. FIGS. 15A and 15B are signal waveform diagrams showing the restoring and precharging of a memory cell, taking the BS resistance into account. The problem of the BS resistance is the insufficient restoring of a memory cell due to an RC delay composed of the resistance value and the value of the parasitic capacitance on the bit line BL. That is, as the BS resistance value becomes larger, it takes more time to restore the memory cell (RAS Restore) due to the RC delay.

As shown in FIG. 15A, since there is a sufficient restore time left in the tCK long cycle even when the RC component increases due to the BS resistance, the restore level for the memory cell CE1 taking into account the BS resistance shown by a solid line in the figure reaches an ideal restore level shown by a broken line. That is, in the tCK long cycle, the memory cell CE1 can be written into sufficiently.

However, as shown in FIG. 15B, the BS resistance has a great effect in the tCK short cycle. That is, the restore level for the memory cell CE1 taking into account the BS resistance shown by a solid line in FIG. 15B is much less than the ideal restore level shown by the broken line, with the result that the insufficient restoring of the memory cell CE1 becomes significant.

Normally, manufactured memories are subjected to the die sort test. At that time, memory chips determined to be faulty are discarded. Memory chips whose BS resistance value has increased due to the cause related to manufacturing processes must be screened in the die sort test. Because of the nature of the die sort test, a relatively low speed tester generally has to be used. The cycle time tCK of a tester used in the die sort test is 32 ns or longer, for a long cycle, depending on the tester. For this reason, use of a low-speed tester makes it impossible to screen defective memory cells, such as BS resistances.

Since the defects cannot be screened without a test with a high-speed tester after memory cells are sealed in packages, this makes it impossible to restore the defective memory cells, which decreases the yield.

In the memory of the embodiment, the delay time in deactivating the activated bank select signal in the test mode is made different from that in the normal mode at the bank timer circuit. That is, in the test mode, the restore time is made shorter than in the normal mode. This makes it possible to carry out the die sort test using a relatively low-speed tester to screen defective memory cells whose BS resistance value has increased. That is, a test with a high-speed tester after memory cells are sealed in packages is unnecessary and restoration using a redundancy function can be performed, which prevents the yield from decreasing.

In the bank timer circuit, when the timing with which a bank is unselected in synchronization with the clock signal is simply adjusted to the column select operation, it may be difficult to adjust the timing with which a bank is unselected so as to meet the desired screening condition for memory cells.

In the embodiment, the second control circuit 212 with the configuration as shown in FIG. 12 is provided in the bank timer circuit 17, which enables a fine adjustment of the time at which the bank is unselected according to the test mode state. This realizes the optimum screening condition.

Figure 16:
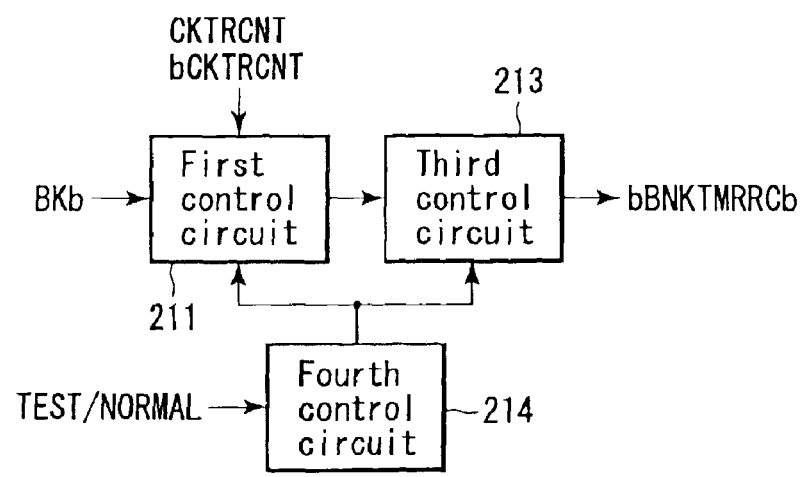
FIG. 16 is a block diagram showing a different internal configuration of the bank timer circuit from that of FIG. 8.

However, when it is easy to adjust the timing with which the bank is unselected so as to meet the desired screening condition for memory cells, the second control circuit 212 in the bank timer circuit 17 can be eliminated. The internal configuration of the bank timer circuit 17 without the second control circuit 212 is shown in the block diagram of FIG. 16. In this case, the signal BNKCKTMRDVb output from the first control circuit 211 is inverted and input as the signal bBNKTMRRCb to the third control circuit 213 of FIG. 9.

This invention is not limited to the above embodiment and may be modified in various ways. For instance, in the first control circuit 211 of FIG. 10, one and a half clocks of the clock signal after the signal BKb goes high in the test mode, the shift signal CLKTM15 goes low. Instead of CLKTM15, however, a shift signal going low earlier than the shift signal CLKTM30 used in the normal mode can be used. Furthermore, the fine-adjusted delay time is not limited to the values listed in Table 1.

What is claimed is:

1. A synchronous semiconductor memory device comprising:
   a plurality of memory banks each of which includes a plurality of memory cells connected to a plurality of word lines and which read data from the memory cells and write data into the memory cells;
   a command decoder circuit which receives a command input in synchronization with an external clock signal, detects whether the command is a read command or a write command, and, when detecting a read command or a write command, outputs a first control signal that enables a read operation or a write operation in the plurality of memory banks;
   a plurality of bank select circuits which are provided for the plurality of memory banks in a one-to-one correspondence, receive the first control signal, activate a second control signal to activate each of the memory banks according to the first control signal, and output the second control signal to the plurality of memory banks; and
   a plurality of bank timer circuits which are connected to the plurality of bank select circuits in a one-to-one correspondence, and, after the second control signal is activated, deactivate the activated second control signal in synchronization with an internal clock signal synchronizing with the external clock signal, and perform control in such a manner that the timing with which the second control signal is deactivated in a test mode differs from that in a normal mode.

2. The memory device according to claim 1, wherein each of the plurality of the memory cells includes a cell transistor and a cell capacitor, respectively.

3. The memory device according to claim 1, wherein the test mode is a test mode in which defective memory cells are screened.

4. The memory device according to claim 1, wherein each of the plurality of bank select circuits includes a flip-flop circuit which receives a signal corresponding to the first control signal and the output signal of the bank timer circuit.

5. The memory device according to claim 1, further comprising a word-line driving enable circuit which receives the second control signal output from each of the plurality of bank select circuits and enables the word line in the corresponding one of said plurality of memory banks to be selected according to the second control signal.

6. The memory device according to claim 1, wherein each of the plurality of bank timer circuits deactivates the activated second control signal by shifting the second control signal in synchronization with the internal clock signal in such a manner that, in the test mode, the bank timer circuit deactivates the second control signal after shifting the second control signal by the number of first clocks of the internal clock signal and that, in the normal mode, the bank timer circuit deactivates the second control signal after shifting the second control signal by the number of second clocks larger than the number of first clocks of the internal clock signal.

7. The memory device according to claim 6, wherein, after the second control signal is activated, each of the plurality of bank timer circuits, in the test mode, deactivates the second control signal after shifting the second control signal by 1.5 clocks of the internal clock signal and, in the normal mode, deactivates the second control signal after shifting the second control signal by 3 clocks of the internal clock signal.

8. The memory device according to claim 1, wherein each of the plurality of bank timer circuits includes an adjusting circuit which, in the test mode, adjusts the activating period of the second control signal according to the setting state of the test mode.

9. The memory device according to claim 1, wherein each of the plurality of bank timer circuits includes a plurality of shift circuits connected in multistage form which shift a third control signal synchronizing with the second control signal in synchronization with the internal clock signal, and a select circuit which selects the shift output signal of any one of the plurality of shift circuits according to a fourth control signal.

10. The memory device according to claim 9, wherein each of the plurality of bank timer circuits includes a delay circuit which delays the shift output signal output from the select circuit for a specific period according to the setting state of the test mode.

11. The memory device according to claim 1, wherein each of the plurality of bank timer circuits includes a plurality of half-bit shift circuits connected in multistage form which shift the third control signal synchronizing with the second control signal by half a bit of the internal clock signal sequentially in synchronization with the internal clock signal, a first select circuit which, in the test mode, selects a first shift output signal obtained by shifting the third control signal by 1.5 clocks of the internal clock signal from the shift output signals of the plurality of half-bit shift circuits, and a second select circuit whose output node is connected to the output node of the first select circuit and which, in the normal mode, selects a second shift output signal obtained by shifting the third control signal by 3 clocks of the internal clock signal from the shift output signals of the plurality of half-bit shift circuits.

12. A method of controlling a synchronous semiconductor memory device having a plurality of memory banks each of which includes a plurality of memory cells connected to a plurality of word lines and which read data from the memory cells and write data into the memory cells, the method comprising:

receiving a command input in synchronization with an external clock signal, detecting whether the command is a read command or a write command, and, when detecting a read command or a write command, outputting a first control signal that enables a read operation or a write operation in the plurality of memory banks,;

activating a second control signal to activate each of the plurality of memory banks according to the first control signal; and after the second control signal is activated, deactivating the activated second control signal in synchronization with an internal clock signal synchronizing with the external clock signal, and making the timing with which the second control signal is deactivated in a test mode different from that in a normal mode.

13. The method according to claim 12, wherein the test mode is a mode in which defective memory cells are screened.

14. The method according to claim 12, wherein the control to deactivate the activated second control signal is performed by shifting the second control signal in synchronization with the internal clock signal, and in the test mode, the second control signal is deactivated after the second control signal is shifted by the number of first clocks of the internal clock signal, and in the normal mode, the second control signal is deactivated after the second control signal is shifted by the number of second clocks larger than the number of first clocks of the internal clock signal.

15. The method according to claim 14, wherein after the second control signal is activated, in the test mode, the second control signal is deactivated after the second control signal is shifted by 1.5 clocks of the internal clock signal and, in the normal mode, the second control signal is deactivated after the second control signal is shifted by 3 clocks of the internal clock signal.

16. The method according to claim 14, wherein the activating period of the second control signal is adjusted according to the setting state of the test mode in the test mode.

* * * * *